United States Patent
Krause et al.

(10) Patent No.: US 9,238,877 B2
(45) Date of Patent: Jan. 19, 2016

(54) METHOD FOR PRODUCING A SILICON INGOT BY SOLIDIFICATION OF A MELT COMPRISING A NUCLEATION AGENT INCLUDING NANOSCALE PARTICLES

(75) Inventors: Andreas Krause, Radebeul (DE); Bernhard Freudenberg, Coburg (DE); Gerd Fischer, Dohna OT Borthen (DE); Josef Stenzenberger, Freiberg (DE); Mark Hollatz, Dresden (DE); Armin Müller, Freiberg (DE)

(73) Assignee: SolarWorld Innovations GmbH, Freiberg/Sachen (DE)

( * ) Notice: Subject to any disclaimer, the term of this patent is extended or adjusted under 35 U.S.C. 154(b) by 1056 days.

(21) Appl. No.: 13/339,488

(22) Filed: Dec. 29, 2011

(65) Prior Publication Data

US 2012/0175622 A1 Jul. 12, 2012

(30) Foreign Application Priority Data

Jan. 12, 2011 (DE) .................. 10 2011 002 599

(51) Int. Cl.
*C30B 11/14* (2006.01)
*C30B 29/06* (2006.01)
*C30B 11/00* (2006.01)

(52) U.S. Cl.
CPC ............... *C30B 29/06* (2013.01); *C30B 11/003* (2013.01); *C30B 11/14* (2013.01)

(58) Field of Classification Search
CPC ............ C30B 9/00; C30B 9/04; C30B 11/00; C30B 11/002; C30B 11/04; C30B 11/08; C30B 11/14; C30B 28/00; C30B 28/04; C30B 28/06

USPC .................. 117/11, 73, 76, 81–83, 928, 931; 977/773, 778, 779, 784, 902, 932

See application file for complete search history.

(56) References Cited

U.S. PATENT DOCUMENTS

| | | | |
|---|---|---|---|
| 6,110,274 A * | 8/2000 | Okuno ............................ | 117/81 |
| 2002/0086119 A1 * | 7/2002 | Hariharan et al. ............ | 427/453 |
| 2008/0257254 A1 | 10/2008 | Linke et al. | |
| 2009/0119882 A1 * | 5/2009 | Uibel ........................... | 23/295 R |
| 2009/0266396 A1 | 10/2009 | Niira et al. | |
| 2009/0280050 A1 | 11/2009 | Ravi et al. | |
| 2010/0024718 A1 | 2/2010 | Orschel et al. | |
| 2010/0107965 A1 * | 5/2010 | Fukui et al. ...................... | 117/35 |
| 2010/0127221 A1 | 5/2010 | Weinert et al. | |
| 2010/0261007 A1 | 10/2010 | Sato et al. | |
| 2012/0167817 A1 * | 7/2012 | Freudenberg et al. .......... | 117/54 |

FOREIGN PATENT DOCUMENTS

| | | |
|---|---|---|
| DE | 10 2005 013 410 B4 | 9/2006 |
| DE | 10 2010 000 687 | 7/2011 |
| WO | 2009/153152 A1 | 12/2009 |

* cited by examiner

Primary Examiner — Kenneth A Bratland, Jr.
(74) Attorney, Agent, or Firm — McGlew and Tuttle, P.C.

(57) ABSTRACT

Method for producing a silicon ingot, comprising the following steps: providing a container to receive a silicon melt, providing a temperature control device to control the temperature of the silicon melt in the container, arranging raw material in the container comprising silicon and at least one nucleation agent to assist a heterogeneous nucleation in the silicon melt, and control of the temperature in the container for the directed solidification of the silicon melt, the nucleation agent comprising nanoscale particles.

30 Claims, 1 Drawing Sheet

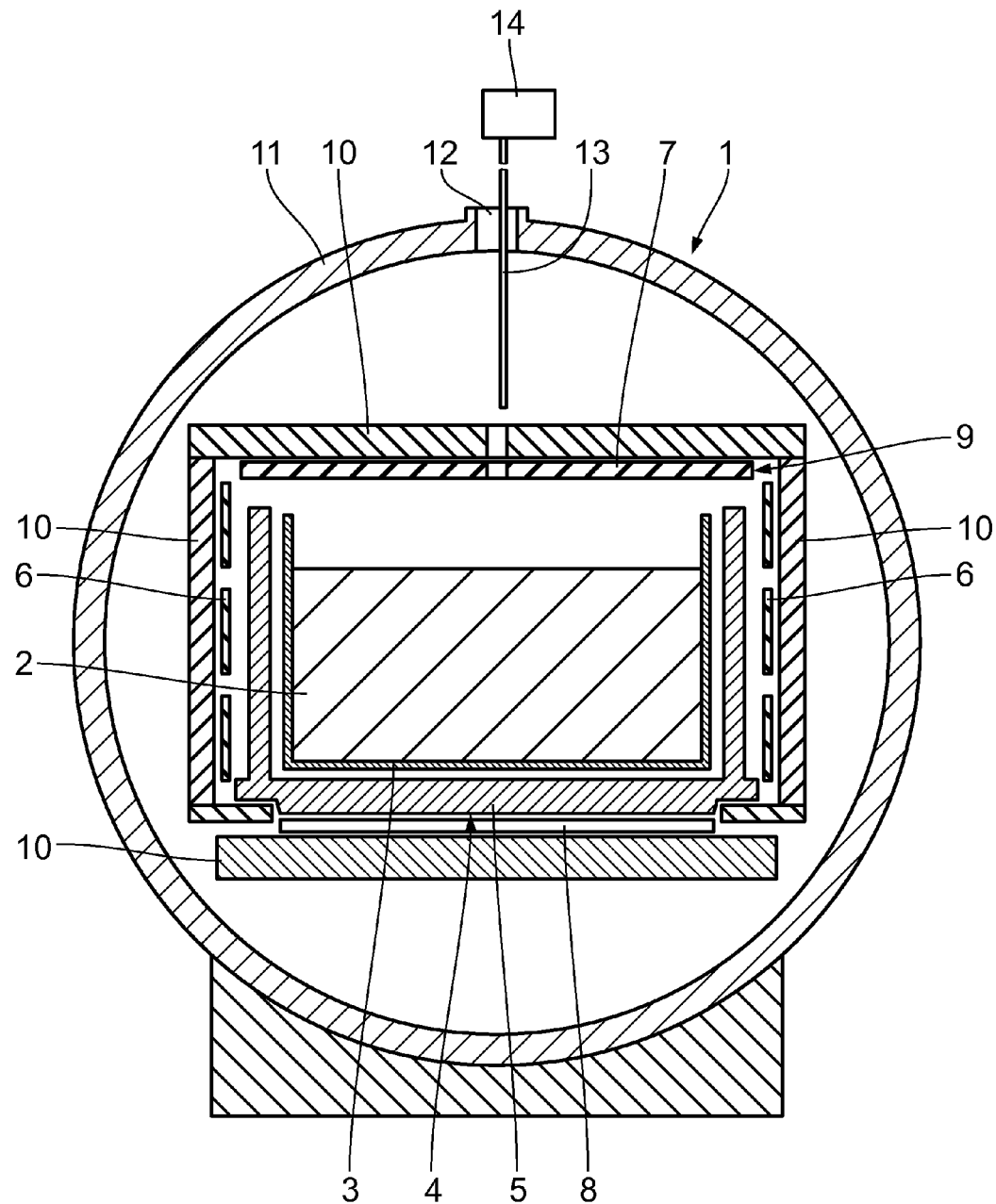

METHOD FOR PRODUCING A SILICON INGOT BY SOLIDIFICATION OF A MELT COMPRISING A NUCLEATION AGENT INCLUDING NANOSCALE PARTICLES

CROSS-REFERENCES TO RELATED APPLICATIONS

This application claims the priority of German Patent Application, Serial No. 10 2011 002 599.5, filed Jan. 12, 2011, pursuant to 35 U.S.C. 119(a)-(d), the content of which is incorporated herein by reference in its entirety as if fully set forth herein.

FIELD OF THE INVENTION

The invention relates to a method for producing a silicon ingot. The invention furthermore relates to a silicon ingot and a silicon wafer.

BACKGROUND OF THE INVENTION

A method for producing a silicon ingot is known from DE 10 2005 013 410 B4. As the crystal structure of a silicon ingot of this type has a substantial effect on the properties of the components subsequently produced therefrom, there is a continuous need to improve a method of this type.

The invention is therefore based on the object of improving a method for producing a silicon ingot.

This object is achieved by a method for producing a silicon ingot comprising the following steps of providing a container to receive a silicon melt, providing a temperature control device to control the temperature of the silicon melt in the container, arranging raw material in the container comprising silicon and at least one nucleation agent to assist a heterogeneous nucleation in the silicon melt, and control of the temperature in the container in such a way that the raw material is present, during a specific method portion, as silicon melt in the container, which is solidified in a directed manner during a subsequent method portion, wherein the nucleation agent comprises nanoscale particles.

The core of the invention is to add a nucleation agent to the silicon for producing a silicon ingot to assist a heterogeneous nucleation in the silicon melt. Owing to the heterogeneous nucleation a grain refinement occurs in the volume of the silicon ingot, the grain refinement being able to occur in an increased extent in the lower volume close to the base. The heterogeneous nucleation is furthermore a prerequisite for a growth-induced grain selection, in which crystallites rich in defects are overgrown by those low in defects. As a result, the defect density, in particular the dislocation density, is significantly reduced in the silicon crystal.

The structure close to the base firstly consists both of crystallites that are rich in defects as well as those free of defects. It was recognised according to the invention that the crystallites rich in defects are overgrown by crystallites free of defects with suitable control of the crystallisation process. The method according to the invention therefore leads to the production of a silicon ingot with a particularly low defect density over the entire ingot height. In particular, a dislocation multiplication is suppressed by the method according to the invention, so that theoretically ingots of any height can be produced.

According to the invention, it was further recognised that it is advantageous for the configuration of a crystal structure low in defects if the crystallites that are rich in defects have a large number of neighbours low in defects. This can be achieved in particular, in that the nucleation agent comprises nanoscale particles. Nanoscale particles are taken to mean here particles, the diameters of which are in the range from 10 nm to 10 µm, in particular in the range from 10 nm to 1 µm, in particular in the range from 10 nm to 500 nm, in particular in the range from 20 nm to 100 nm. In particular, the mean grain size of the particles is less than 1 µm, in particular less than 200 nm.

The nanoscale particles can be mixed with the raw material as a solid material, called an addition below. Alternatively, particles can also be advantageously formed by melt synthesis in the silicon melt, called precipitation below. The effect is utilised here that with an adequate concentration of the nucleation agent components in the silicon melt, a supersaturation precipitation of the nucleation agents occurs during the solidification or further cooling. Advantageously, the size of the nucleation agent particles precipitated here can be controlled in a targeted manner by a targeted conduct of the process, in particular by suitable control of the temperature course during the solidification of the silicon melt.

The chemical nature of the particles used as nucleation agents primarily consist of the quaternary system Si—O—N—C. At least 90% by weight of the particles preferably originate from this substance system.

The composition can be defined by $Si_1C_xO_yN_z$, wherein there applies: X: 0-2, Y: 0-3, Z: 0-4, wherein X, Y, Z does not necessarily have to be integral. In particular, the known stoichiometric compounds $SiC$, $SiO_2$, $Si_3N_4$, $Si_2N_2O$ are contained in this quaternary system.

The particles preferably form getter centres for movable metal atoms in the silicon ingot. This effect is based on the fact that movable metal atoms in the silicon ingot have a greater affinity to specific precipitations. The nucleation agent particles can, in particular, hinder the diffusion of harmful metal atoms into the ingot.

Addition variant: in an advantageous embodiment, the finely dispersed nucleation agent of the $Si_1C_xO_yN_z$ system is added to the raw material during the filling of the mould. It was surprisingly established that the particles survive the melt process although at least individual ones of the dissolved O-, C- and/or N-concentrations are below the equilibrium concentrations known in the literature. These particles develop their nucleation agent effect during the subsequent solidification process.

Precipitation variant: in a further advantageous embodiment, the nucleation agent, in particular the nucleus components, during one method portion, is/are completely, or at least partially, dissolved in the silicon melt. This allows a particularly uniform distribution of the precipitating nucleation agent.

The precipitation agent is preferably arranged in the crucible in such a way that it, in particular at least one, preferably more or all its components in the dissolved state, has/have a concentration in the silicon melt, which is greater, at least in regions, than a saturation concentration of the respective component or the respective components in the silicon melt. This leads to a supersaturation precipitation of the nucleation agent occurring while the melt is being cooled. According to the invention, the precipitation of the nucleation agent substantially occurs before the solidification of the melt.

By suitable control of the temperature field in the melt crucible, in particular by suitable control of the convection in the crucible, the supersaturation precipitation can be limited to specific regions in the melt, in particular to the region close to the crucible base. Moreover, the size of the precipitation can be influenced by controlling the temperature field and the temperature course in the crucible. It was determined in this regard that a stronger convection leads to a smaller size of the precipitated particles. The convection in the crucible is therefore advantageously controlled in a targeted manner at least during a predetermined method portion, in particular before the beginning of the solidification of the silicon melt by means of the temperature control device.

The nucleation agent can preferably be arranged in the container in such a way that a concentration gradient thereof occurs in the silicon melt. The concentration of the nucleation agent, in particular in a volume region close to the base, is higher here than in the remainder of the silicon melt. As a result, the crystallites rich in defects can be concentrated to the region of the silicon ingot close to the base. This region, i.e. the ingot base, is separated in any case from the silicon ingot in the further process. The remainder of the ingot has a correspondingly improved crystal structure.

The nucleation agent particles, at least in a specific region in the silicon melt, in particular in the region of the crucible close to the base, preferably have a density (particles per volume unit) of at least $10^2$ cm$^{-3}$, in particular at least $10^4$ cm$^{-3}$, in particular at least $10^7$ cm$^{-3}$.

A further object of the invention consists in providing an improved silicon ingot.

This object is achieved by a silicon ingot comprising a longitudinal axis, a first end in the direction of the longitudinal axis, a second end in the direction of the longitudinal axis, a length in the direction of the longitudinal axis, a multi-crystalline structure and a grain density, which, in the region of the first end, is at least 400 dm$^{-2}$, in particular at least 600 dm$^{-2}$, in particular at least 800 dm$^{-2}$.

The core of the invention consists in providing a silicon ingot with a high grain density at the end, in particular on the base side. The advantages of the ingot according to the invention emerge from those which were already described in relation to the production method thereof A further object of the invention consists in providing a silicon wafer with a small defect density and low metal content. This object is achieved by a silicon wafer made of multi-crystalline silicon with a wafer surface and with particles, wherein at least 90% of the particles have a diameter of at most 1 µm, and the particles have a fraction of a compound of silicon and at least one of the elements selected from the group of carbon, oxygen and nitrogen.

Further advantages, features and details of the invention emerge from the description of embodiments.

BRIEF DESCRIPTION OF THE DRAWING

FIG. 1 shows a device for carrying out the method according to the invention.

DESCRIPTION OF THE PREFERRED EMBODIMENTS

A crystallisation system 1 for crystallising a silicon melt 2 comprises a container configured as a mould 3 to receive the silicon melt 2. The mould 3 is open at the top. It may have a rectangular, in particular a square cross-section. It may also have a round, in particular a circular cross-section. It has a mould base. The mould 3 is surrounded by a support mould 4, also open at the top. The latter comprises a base plate 5, which is in turn carried by a frame, not shown in the figure. The mould 3 is laterally surrounded by side heating plates 6. A cover heating plate 7 is arranged above the mould 3. A base heating plate 8 is also provided below the mould 3.

In addition or alternatively to the heating plates 6, 7 and 8, cooling elements can be provided laterally, above and below the mould 3.

The heating plates 6, 7 and 8 and/or the cooling elements are preferably controllable. The heat plates 6, 7 and 8 and the cooling elements together form a temperature control device 9 for melting and/or directed solidification of the silicon in the mould 3. Reference is made to DE 10 2005 013 410 B4, for example, for details of the temperature control device 9.

The mould 3 can also be surrounded by a large number of insulation elements 10.

The mould 3 is arranged in an outwardly sealed crystallisation chamber 11. The crystallisation chamber 11 has a feedthrough 12 for a flushing tube 13. The crystallisation chamber 11 can be loaded with flushing gas by means of a flushing gas device 14 via the flushing tube 13. Argon is provided as the flushing gas, in particular. Alternatively, another inert protective gas can also be used. A process gas, such as carbon monoxide, nitrogen or ammonia can furthermore be added for the melt synthesis. The atmosphere in the crystallisation chamber 11, in particular, can be controlled in a targeted manner by means of the flushing gas device 14.

The method according to the invention for producing a silicon ingot will be described below. Firstly, the crystallisation system 1 is prepared to melt and crystallise the silicon melt 2 in the mould 3. In particular, the mould 3 is prepared to receive the silicon melt 2 and the temperature control device 9 to control the temperature of the silicon melt 2 in the mould 3. Raw material is then arranged in the mould 3. The raw material comprises silicon, in particular high-purity silicon or "solar grade" silicon. The silicon of the raw material in particular has a degree of purity of at least 99.9%, in particular at least 99.99%, in particular at least 99.999%.

To produce the silicon ingot, the temperature in the mould 3 is controlled by means of the temperature control device 9. The temperature in the mould 3 is, in particular, controlled in such a way that the raw material is present during a specific method portion, as silicon melt 2 in the mould 3, which is solidified in a directed manner during a subsequent method portion. For details of the directed solidification of the silicon melt 2, reference is made to DE 10 2005 013 410 B4.

The raw material, in particular the silicon, is supplied to the mould 3 in solid form. It is melted in the mould 3. However, it is also possible for the raw material, in particular the silicon, to be melted before supplying it to the mould 3 and to be supplied to the mould 3 in liquid form.

According to the invention, it is provided that the raw material in the mould 3 comprises at least one nucleation agent to assist a heterogeneous nucleation in the silicon melt 2. In the addition variant, corresponding nucleation agent particles are added; in the precipitation variant, nucleus components that are dissolvable in liquid silicon are added which firstly dissolve in the silicon melt 2, then precipitate. Both variants, i.e. the added particles and the dissolvable nucleus components will be called nucleation agents below.

The nucleation agent comprises nanoscale particles. It preferably consists of nanoscale particles, whether added or precipitated. Nanoscale particles are taken to mean here particles with a diameter in the range from 10 nm to 10 µm, in particular in the range from 10 nm to 1 µm, in particular in the range from 10 nm to 500 nm, in particular in the range from 20 nm to 200 nm.

The nucleation agent comprises at least one fraction of a compound of the quaternary system Si—O—N—C. It consists, in particular at least 90% by weight, of compounds of this substance system. It can, in particular, completely consist of compounds of this type. It can comprise one or more compounds of this type. The compounds are, in particular, selected from the group of silicon carbide (SiC), silicon dioxide ($SiO_2$), silicon nitride ($Si_3N_4$) and silicon oxynitride ($Si_2N_2O$). The nucleation agent preferably consists of one of these compounds or a mixture of two or all these compounds.

According to the invention, it is provided that the fraction of nucleation agents in the raw material be selected in such a way that the total fraction of carbon, oxygen and nitrogen in the silicon melt 2 is in the range from 0.001% by weight to 1% by weight, in particular in the range from 0.001% by weight to 1% by weight, in particular in the range to 0.1% by weight, in particular in the range to 0.02% by weight.

The particles of the nucleation agent have, at least in a specific region in the silicon melt 2, a density of at least $10^2$ $cm^{-3}$, in particular at least $10^4$ $cm^{-3}$, in particular at least $10^7$ $cm^{-3}$. This region comprises a volume of at most 100%, in particular at most 50%, in particular at most 25%, in particular at most 15% of the silicon melt 2, but at least 1% by vol., in particular at least 5% by vol.

The nucleation agent is, in particular, arranged in the silicon melt 2 in such a way that the volume region with said particle density comprises the region of the silicon melt 2 close to the base. The nucleation agent is preferably arranged in the mould 3 in such a way that a concentration gradient of the nucleation agent, in particular of the dissolved component, occurs in the silicon melt 2. The concentration of the nucleation agent in the region of the mould base is higher here than in the remainder of the silicon melt 2.

According to a first embodiment of the invention, the nanoscale particles are supplied to the mould 3 as a solid material. The nucleation agent is in particular, supplied in the form of finely dispersed powder to the mould 3. The nucleation agent can be supplied here in particularly well dispersed form as a cover layer on the surface of silicon particles, in particular finely dispersed silicon particles, to the mould 3. According to the invention, in this case, the surface of the Si powder used is at least 2 $m^2/g$, in particular at least 5 $m^2/g$, in particular at least 10 $m^2/g$. During the melting of the silicon particles, the nucleation agent remains as nanoscale particles in the silicon melt.

The nucleation agent originates, in particular, as described above, from the $Si_1C_xO_yN_z$ system and corresponds, for example, to the compound $Si_2N_2O$, i.e. X=0, Y=0.5 and Z=1. Alternatively, highly dispersed silicon carbide, SiC, can be used as the nucleation agent. Alternatively, silicon dioxide ($SiO_2$) can very easily supplied to the mould 3 in this manner as the third variant.

According to the invention, it is provided that between 2 g and 200 g, in particular between 20 g and 100 g, in particular between 40 g and 60 g silicon oxynitride ($Si_2N_2O$) are to be supplied to the mould 3 for 450 kg high-purity silicon.

The nanoscale particles of the nucleation agent are preferably arranged in the region of the mould 3 close to the base.

Good results were also achieved by adding silicon carbide (SiC) in the range from 20 g to 200 g silicon carbide (SiC) per 450 kg silicon melt 2. The addition of from 25 g to 100 g, in particular from 50 g to 75 g, in particular from 60 g to 70 g silicon carbide (SiC) per 450 kg silicon, is preferred.

In general, good results were achieved with an overall carbon content in the range from 10 g to 120 g carbon, in particular from 20 g to 90 g per 450 kg silicon melt 2.

For the addition of silicon nitride ($Si_3N_4$), weighed-in amounts of 10 g to 200 g, in particular from 50 g to 150 g per 450 kg silicon melt 2 have proven to be particularly advantageous.

Of course, a mixture of the above-mentioned nucleation agents can be added in similar quantities. The total quantity of the added nucleation agent is preferably less than 200 g per 450 kg silicon.

According to a further embodiment of the invention, the precipitation variant, it is provided that so much nucleation agent, in particular nucleus components, be supplied to the mould 3 in a targeted manner that the latter substantially goes into solution during a method step, in particular completely, in the silicon melt 2. The concentration of the nucleation agent in the silicon melt 2 and the conduct of the process of the solidification process are selected such that during the cooling of the silicon melt 2, the saturation limit for the nucleation agent is exceeded. The concentration of the nucleation agent in the silicon melt 2 is, in particular greater, at least in regions, than a saturation concentration of the nucleation agent in the silicon melt 2, in particular above the crystallisation temperature thereof As a result, precipitation of the nucleation agent occurs during the cooling of the silicon melt 2. According to this embodiment, the nanoscale particles of the nucleation agent are therefore formed by melt synthesis.

The nucleation agent involves the same substances as in the embodiment described above, to the description of which reference is hereby made.

According to the invention, it was determined that the size of the precipitations of the nucleation agent during the solidification of the melt depends, in particular, on the supersaturation of the nucleation agent in the silicon melt 2, the convection and the undercooling of the silicon melt 2. It is provided according to the invention that the convection be controlled in a targeted manner in the silicon melt 2 by means of the temperature control device 9.

The convection in the silicon melt 2 is controlled in a targeted manner at least during a predetermined method portion, in particular before the beginning of the solidification of the silicon melt 2, by means of the temperature control device 9. It is preferably controlled in such a way that it is limited to a volume of at most 50%, in particular at most 25%, in particular at most 10%, but at least 1%, in particular at least 5% of the silicon melt 2 in the region of the container base.

The precipitation of the nanoscale nucleation agent particles is therefore limited to this region. This is important, in particular when using silicon dioxide ($SiO_2$) as the nucleation agent, as interstitially dissolved oxygen acts negatively on the electric properties of the silicon ingot.

A very uniform distribution of the nucleation agent in the silicon melt 2 can be achieved owing to the melt synthesis. Moreover, the distribution of the diameters of the nucleation agent particles can be easily controlled in a targeted manner.

In order to ensure that the crystallites that are rich in defects and formed on the nucleation agent are overgrown by defect-free ones as the crystallisation course progresses, the temperature course in the silicon melt 2 is controlled in a targeted manner during the solidification thereof by means of the temperature control device 9. In particular, the temperature in the silicon melt 2 is controlled in such a way that the crystallites rich in defects do not have enough energy to grow, This is achieved by a small undercooling of the silicon melt 2, i.e. a crystal growth close to equilibrium takes place.

It is possible in all the embodiments described above to arrange the nucleation agent with a spatially varying concentration in the mould 3. The concentration of the nucleation agent in a region close to the base of the mould 3 can be greater here than in a region which is further away from the base of the mould 3. The nucleation agent can, in particular, be arranged in the mould 3 in such a way that a gradient thereof forms in the silicon melt 2, the concentration of the nucleation agent decreasing in the silicon melt 2 with an increasing spacing from the base of the mould 3.

Moreover, it may be provided in all the embodiments described above that the nucleation agent be supplied at a certain time, at certain times or during certain phases of the melt and/or solidification process to the mould 3. In particular, it can be provided that the addition be supplied to the mould 3 before the beginning of the melting of the raw material of the mould 3. It can also be provided that the nucleation agent be supplied to the mould only after the beginning of the melting of the silicon.

Obviously, the different embodiments may be combined with one another.

The silicon ingot produced according to the invention has a length L in the direction of a longitudinal axis, which, in particular, corresponds to a growth axis. It has a multi-crystalline structure. In the region of a first end in the direction of the longitudinal axis, which is formed by a lower end of the ingot in the mould 3, the silicon ingot has an increased grain density, which, in the direction perpendicular to the longitudinal axis, is at least 400 $dm^{-2}$, in particular at least 600 $dm^{-2}$, in particular at least 800 $dm^{-2}$. The region of this grain density that is very high at the end is limited to at most 20 cm, in particular at most 10 cm, in particular at most 5 cm, in particular at most 2 cm, in particular at most 1 cm from the first end of the ingot. This region is hereafter cut off, in particular sawn off It is designated the end region below. In the remaining region, the silicon ingot has a grain density, which is substantially lower. It is in particular, lower at least by a factor of 1.5, in particular at least by a factor of 2, in particular at least by a factor of 3, lower than in the region of the first end, in other words in the end region.

The silicon ingot produced according to the invention is distinguished by a particularly advantageous crystal structure. It is, in particular, low in defects. In the end region, the surface fraction with a reduced defect density is in particular at least 90%, in particular at least 95% of the cross-sectional area of the silicon ingot. A region with a reduced defect density is taken to mean here a region with a dislocation density of less than $10^5$ $cm^{-2}$. In the region adjoining the end region, the surface fraction with a reduced defect density is at least 80%, in particular at least 85%, in particular at least 90%, in particular at least 95% of the cross-sectional area of the silicon ingot.

Silicon wafers can be produced from the silicon ingot produced according to the invention. These are multi-crystalline silicon wafers.

The wafers have a wafer surface. They may be round, in particular circular, or quadrangular, in particular square. The wafers have a multi-crystalline structure. They have particles. At least 90% of the particles preferably have a diameter of at most 1 μm. The particles have silicon and at least one fraction of a compound of at least one of the elements selected from the group of carbon, oxygen and nitrogen. The density of the particles in the wafer is at least $10^2$ $cm^{-3}$, in particular at least $10^4$ $cm^{-3}$, in particular at least $10^7$ $cm^{-3}$.

The wafers are particularly low in defects. The surface fraction with a reduced defect density is at least 80%, in particular at least 85%, in particular at least 90%, in particular at least 95% of the wafer surface.

The wafers, in a region of at least 80%, in particular at least 90%, in particular at least 95%, of the wafer surface, have a grain density of at least 600 $dm^{-2}$, in particular at least 400 $dm^{-2}$, in particular at least 300 $dm^{-2}$.

What is claimed is:

1. A method for producing a silicon ingot comprising the following steps:

providing a container to receive a silicon melt;
providing a temperature control device to control the temperature of the silicon melt in the container;
arranging raw material in the container, said raw material comprising silicon and at least one nucleation agent to assist a heterogeneous nucleation in the silicon melt; and
controlling the temperature in the container such that the raw material is present, during a specific method portion, as silicon melt in the container, which is solidified in a directed manner during a subsequent method portion, wherein the nucleation agent comprises nanoscale particles, said nanoscale particles being mixed with the silicon as a solid material.

2. A method according to claim 1, wherein the nanoscale particles are supplied to the container as said solid material.

3. A method according to claim 1, wherein the particles have a surface of at least 2 $m^2/g$.

4. A method according to claim 1, wherein the particles have a surface of at least 5 $m^2/g$.

5. A method according to claim 1, wherein the particles have a surface of at least 10 $m^2/g$.

6. A method according to claim 1, wherein the particles form getter centers for movable metal atoms in the silicon ingot.

7. A method according to claim 1, wherein the nucleation agent comprises at least one fraction of a compound of silicon and at least one of the elements selected from the group of carbon, oxygen and nitrogen.

8. A method according to claim 1, wherein the nucleation agent comprises at least one fraction of a compound selected from the group of silicon carbide (SiC), silicon dioxide ($SiO_2$), silicon nitride ($Si_3N_4$) and silicon oxynitride ($Si_2N_2O$).

9. A method according to claim 1, wherein the nucleation agent is arranged in the container in such that the nucleation agent has a concentration in the silicon melt, which is greater, at least in regions, than a saturation concentration of the nucleation agent in the silicon melt at the crystallization temperature thereof.

10. A method according to claim 1, wherein the nucleation agent is arranged in the container such that a concentration gradient of the nucleation agent occurs in the silicon melt.

11. A method according to claim 10, wherein the concentration is higher in the region of a container base than in a remainder of the silicon melt.

12. A method according to claim 1, wherein the particles, at least in a specific region in the silicon melt, have a density of at least $10^2$ $cm^{-3}$.

13. A method according to claim 1, wherein the particles, at least in a specific region in the silicon melt, have a density of at least $10^4$ $cm^{-3}$.

14. A method according to claim 1, wherein the particles, at least in a specific region in the silicon melt, have a density of at least $10^7$ $cm^{-3}$.

15. A method according to claim 1, wherein a convection is controlled in a targeted manner in the silicon melt, at least during a predetermined method portion by means of the temperature control device.

16. A method according to claim 15, wherein a convection is controlled in a targeted manner in the silicon melt before the beginning of the solidification of the silicon melt by means of the temperature control device.

17. A method according to claim 1, wherein the nucleation agent is added to the silicon during filling of the container.

18. A method according to claim 1, wherein the nucleation agent does not form a coating of the container.

19. A method for producing a silicon ingot comprising the following steps:
- providing a container to receive a silicon melt;
- providing a temperature control device to control the temperature of the silicon melt in the container;
- arranging raw material in the container, said raw material comprising silicon and at least one nucleation agent to assist a heterogeneous nucleation in the silicon melt; and
- controlling the temperature in the container such that the raw material is present, during a specific method portion, as silicon melt in the container, which is solidified in a directed manner during a subsequent method portion, wherein the nucleation agent comprises nanoscale particles, said nanoscale particles being formed by melt synthesis, wherein the nucleation agent is completely dissolved in the silicon melt during a method portion.

20. A method according to claim 19, wherein the nucleation agent does not form a coating of the container.

21. A method for producing a silicon ingot comprising the following steps:
- providing a container comprising a container interior space;
- providing a temperature control device;
- providing silicon in the container interior space;
- adding at least one nucleation agent to the silicon in the container interior space; and
- controlling the temperature in the container such that the silicon is present, during a specific method portion, as silicon melt in the container, which is solidified in a directed manner during a subsequent method portion, said nucleation agent providing a heterogeneous nucleation in the silicon melt, said nucleation agent comprising nanoscale particles, said nanoscale particles being formed by melt synthesis, wherein the nucleation agent is completely dissolved in the silicon melt during the specific method portion.

22. A method according to claim 21, wherein the particles have a surface of at least 2 $m^2/g$.

23. A method according to claim 21, wherein the particles have a surface of at least 5 $m^2/g$.

24. A method according to claim 21, wherein the nucleation agent does not form a part of a coating of the container.

25. A method according to claim 21, wherein the nucleation agent comprises at least one fraction of a compound of silicon and at least one of the elements selected from the group of carbon, oxygen and nitrogen.

26. A method according to claim 21, wherein the nucleation agent comprises at least one fraction of a compound selected from the group of silicon carbide (SiC), silicon dioxide ($SiO_2$), silicon nitride ($Si_3N_4$) and silicon oxynitride ($Si_2N_2O$).

27. A method according to claim 21, wherein the nucleation agent is arranged in the container such that a concentration gradient of the nucleation agent occurs in the silicon melt.

28. A method according to claim 27, wherein the concentration is higher in the region of a container base than in a remainder of the silicon melt.

29. A method according to claim 21, wherein the particles, at least in a specific region in the silicon melt, have a density of at least $10^4$ $cm^{-3}$.

30. A method according to claim 21, wherein the particles, at least in a specific region in the silicon melt, have a density of at least $10^7$ $cm^{-3}$.

* * * * *